United States Patent [19]

Yerkes

[11] 4,251,288
[45] Feb. 17, 1981

[54] PHOTOVOLTAIC DEVICE WITH SPECIALLY ARRANGED LUMINESCENT COLLECTOR AND CELL

[75] Inventor: John W. Yerkes, Granada Hills, Calif.

[73] Assignee: Atlantic Richfield Company, Los Angeles, Calif.

[21] Appl. No.: 101,334

[22] Filed: Dec. 6, 1979

Related U.S. Application Data

[63] Continuation-in-part of Ser. No. 960,137, Nov. 13, 1978, abandoned.

[51] Int. Cl.³ .............................................. H01L 31/00
[52] U.S. Cl. .................................... 136/247; 136/259
[58] Field of Search ......... 136/89 FC, 89 CA, 89 CL

[56] References Cited

U.S. PATENT DOCUMENTS 4,110,123  8/1978  Goetzberger et al. .......... 136/89 HY

*Primary Examiner*—Aaron Weisstuch
*Attorney, Agent, or Firm*—M. David Folzenlogen

[57] ABSTRACT

A photovoltaic device for collecting solar radiation and converting it to electrical energy has a luminescent collector shaped in a way that maintains collecting area efficiency while allowing the photovoltaic cell to be entirely shadowed or protected from the direct rays of solar energy. The shape of the luminescent collector is also especially suited to air cooling and to placement of insulation between the collector surface and the cell. The collector has a first extension which receives and absorbs the light energy and at least one side extension which extends away from the sun collecting part of the collector. The side extension or extensions conduct the collected light energy to the protected cell or cells. For example, the luminescent collector may have an inverted U-shape or L-shape. A photovoltaic cell is coupled to the side extension, preferably at the end surface of the side extension. Each cell is placed entirely away from surfaces directly heated by the rays of the sun and is entirely shadowed from radiant heating by a part of the photovoltaic device. The underside of the collector may be shaped to form a channel. The channel may be used for air cooling, thermal insulation, or a combination of air cooling and thermal insulation of the sun-receiving part of the collector. The upper outer surface of the collector may be protected by a protective, radiation transmissive cover. Light emissive areas of the edge and lower surfaces of the collector not covered by photovoltaic cells may also be covered by a reflective material.

43 Claims, 5 Drawing Figures

PHOTOVOLTAIC DEVICE WITH SPECIALLY ARRANGED LUMINESCENT COLLECTOR AND CELL

CROSS REFERENCE TO RELATED APPLICATIONS

This application is a continuation-in-part of Copending Application Ser. No. 960,137 filed Nov. 13, 1978, now abandoned by the same inventor and owned by a common assignee, now abandoned.

BACKGROUND OF THE INVENTION

This invention pertains to a photovoltaic device having a luminescent collector with at least one angular side extension and a cell mounted near or on the end edge surface of the side extension protected from the heat of the sun.

A typical photovoltaic solar panel has an array of photovoltaic cells interconnected with copper and mounted inside a metal frame of the type herein illustrated. An easily cleaned radiation transmissive cover sheet is used to protect the upper surface of the cells. The interstices between the cells may be covered with a reflective material to increase their efficiency. The voltage, current and wattage output of a photovoltaic cell decrease with increasing temperature. In the typical panel, the cells are directly exposed to the heat of the sun, whether the sunlight is direct or reflected. It has been proposed to use forced fluid cooling of solar cells, especially when the sunlight is concentrated by focusing or reflective devices, but this reduces the overall efficiency of the system and for many applications forced cooling is impractical.

It has been proposed, in for example, APPLIED OPTICS, Volume 15, No. 10, Pages 2299–2300, October 1976, the disclosure of which is incorporated herein by reference, to convert solar radiation to electrical energy with a solar cell comprised of a planar sheet of luminescent medium with edge coupled semiconductor photocells. The luminescent medium acts as an efficient collector of solar radiation. The collector is a flat sheet of material having parallel upper and lower surfaces. Solar radiation enters the collector through the upper or outer surface. The collector uses luminescent dyes or materials which are selected for their absorption properties, luminescent efficiency and transmittance in the emission region. The luminescent materials tend to absorb light energy in a portion of the solar spectrum. The luminescent materials reradiate the absorbed light energy at a better wavelength or energy form for conversion to electricity by a solar cell. The luminescent materials also radiate the absorbed light energy at an angle which facilitates internal reflection of the captured light energy and prevents loss of light energy from the collector. The surfaces of the collector are kept free of absorptive or nonreflective substances so that the surfaces tend to internally reflect the collected light energy. Much of the useful light energy is thus trapped in the collector and propagates to the edges of the collector where the light energy is emitted into one or more photovoltaic cells. Some of the collected light energy tends to be lost from the collector by successive reflections at the upper or lower surface. The capture properties of the collector have been enhanced by coating or covering the bottom surface of the collector with a mirror-like or diffusive type internal reflective coating. In addition, it has been proposed to use a filtering layer ahead of the upper surface of the collector to reflect or filter out undesired solar radiation.

The planar luminescent collector has edge mounted cells which are in the direct heat of the solar energy or close to surfaces directly heated by the sun. Cells are relatively fragile and difficult to interconnect. A solar panel using the flat luminescent collector with edge mounted cells is, therefore, difficult to manufacture in a sturdy, efficient way where the cells are kept relatively cool.

In this invention, the luminescent collector is angularly shaped and the photovoltaic cell is placed away from surfaces directly heated by the sun and is entirely shadowed from the solar source without loss of collecting area. The special shape of the collector also facilitates manufacture of the panel.

SUMMARY OF THE INVENTION

This invention pertains to a luminescent photovoltaic device for converting solar energy to electrical energy. The device has an angularly shaped luminescent collector with at least two extensions. One extension is adapted to receive and capture the solar radiation energy. The other extension is at an angle of less than 180° to the sun-receiving extension and conducts the captured light energy away from the sun collecting part of the collector to at least one photovoltaic cell which is coupled to the extension, preferably, at its end edge surface. The cell or cells are located entirely away from surfaces directly heated by the sun and are entirely shadowed from the source of light energy by a part of the photovoltaic device. The cells are, therefore, not radiantly heated by the sun to temperatures high enough to reduce cell output. Appropriate portions of the luminescent collector may be covered with a reflective material, preferably, diffusively reflective, to enhance the energy capture properties of the collector. This angular configuration is especially also useful for maximizing energy collecting area while protecting the cells. The configuration also facilitates construction of the solar panel and provides an arrangement especially suited to air cooling, thermally insulating, or both air cooling and thermally insulating, the cells and collector. These and other advantages of this invention will be apparent to those skilled in the art from the following disclosure and appended claims.

DETAILED DESCRIPTION

This invention relates to a photovoltaic device or solar cell for converting solar radiation to electrical energy. The solar radiation emanates from a source which may be the sun, reflectors or concentrating lens.

Figure 1:
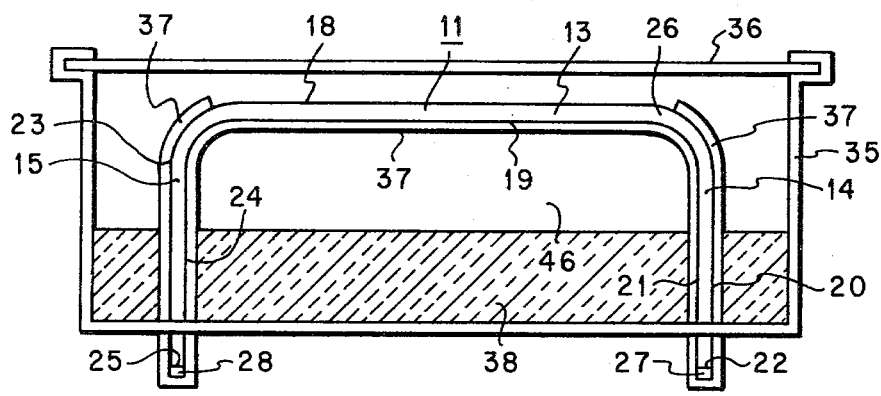
FIG. 1 is an end view of a photovoltaic panel with an inverted U-shaped luminescent collector and edge mounted cells entirely shadowed from the sun.
Figure 3:
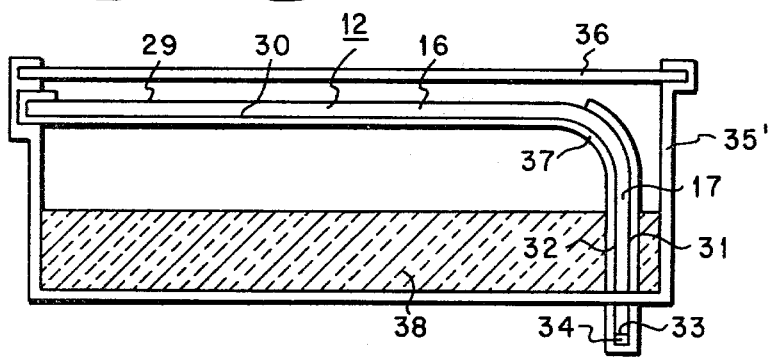
FIG. 3 is an end view of a photovoltaic panel with an inverted L-shaped luminescent collector and edge mounted cells.

The device has a specially shaped luminescent collector member 11 in FIG. 1 and member 12 in FIG. 3. The collector member is made of one or more materials containing one or more luminescent materials, such as, for example, phosphorescent, fluorescent, or similar substances, dyes or agents, which absorb at least a portion of the light energy entering the collector and reradiate or emit the absorbed light. Luminescent materials are well known. For example, the luminescent material may be an organic dye of the type used in lasers and scintillation counters. Luminescent substances are chosen for the wavelength of the light they absorb and the wavelength of the light they reradiate, their luminescent efficiency and transmittance in the wavelength region of the reradiated light. The reradiated light has increased light in a wavelength more suitable for electrical conversion by the type of photovoltaic cell being used. For example, presently used silicon photovoltaic cells have a response peak in a wavelength range of 0.5 to 1.1 micrometers. Several luminescent agents may be incorporated to produce a cascading absorption-reradiation effect. The amount and types of luminescent materials used will, therefore, vary depending upon the type of photovoltaic cell or cells used, the use of the photovoltaic device, the type of light radiation, and the like. The function is as described and one skilled in the photovoltaic art can choose the appropriate materials. The luminescent agents can include pigments, metals or oxides or other compounds of the metals such as neodymium oxide employed in a glass matrix or one or more laser dyes such as the coumarin family of dyes and the rhodamine family of dyes. These dyes are very complex chemically, e.g., coumarin 102 is 2,3,5,6-1H,4H-tetrahydro-8-methylquinolazino-[9,9a,1-gh] coumarin, and rhodamine 110 is o-(6-amino-3-imino-3H-xanthen-9-yl) benzoic acid hydrochloride.

A typical luminescent collector member will be made of a normally transparent material impregnated or infused during manufacture with one or more luminescent materials designed to collect and change the wavelength and/or the direction of light radiation energy. The typical collector will be a specially-shaped, relatively thin sheet-like member of one or more layers with luminescent materials dispersed therein that is either used as is or that is shaped to an appropriate configuration. The base collector material may be a conventional polymeric material such as polymethylmethacrylate, other known acrylic polymers, styrene polymers, and the like. The collector material can also be a glass or other transparent material into which the luminescent materials may be incorporated and which, like the polymeric material, are non-deleterious to such agents and to the photovoltaic cells. The collector material may be the type of light transmitting materials heretofore used to cover conventional nonluminescent photovoltaic devices. The collector will not have internal joints or cracks that prevent propagation of light energy to the photovoltaic cells hereinafter described.

Figure 2:
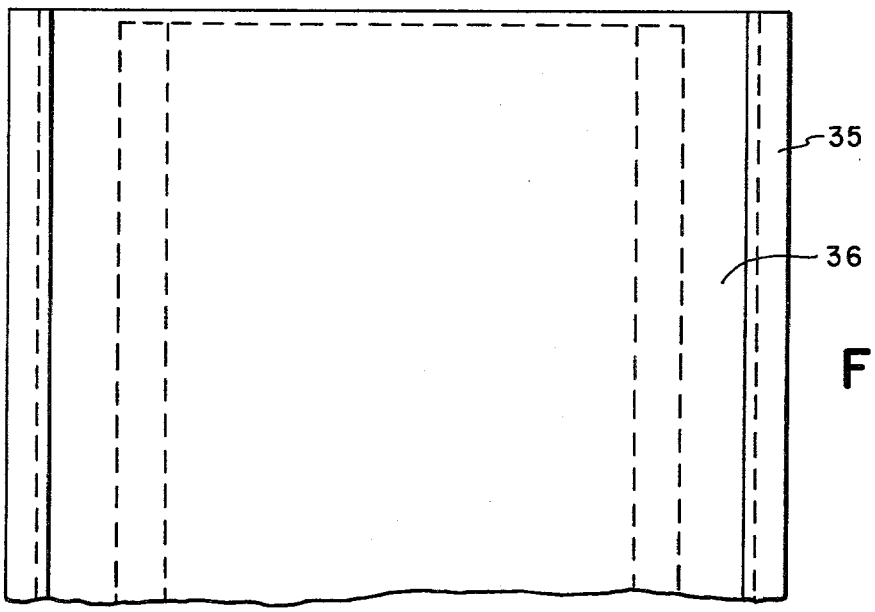
FIG. 2 is a top view of the panel of FIG. 1.

In this invention, the luminescent collector member must have at least two extensions. For example, collector member 11 has three extensions, that is, top or first extension 13, right side or second extension 14, and, on the opposite side of the first extension, left side or third extension 15. On the other hand, collector member 12 has only first extension 16 and second extension 17. As shown by FIGS. 1 and 2, each extension has length, width, thickness, and inner and outer surfaces. The words "inner" and "outer" are determined by reference to the source of solar energy. First extension 13 has outer surface 18 and inner surface 19. A major portion of outer surface 18 is adapted to receive solar radiation emanating from the source. Second extension 14 has outer surface 20, inner surface 21, and end edge surface 22. Third extension 15 has outer surface 23, inner surface 24 and end edge surface 25.

First extension 13 and second extension 14 extend from point 26 in a direction such that the extensions are at an angle to each other of less than 180° and in a direction such that end edge surface 22 of the second extension is further away from the source of solar radiation than outer surface 18 of the first extension when solar radiation is being received by the luminescent collector. In a similar manner, first extension 13 and third extension 15 extend in a direction such that they are at an angle to each other of less than 180° and in a direction such that end edge surface 25 of the third extension is further away from the source of solar radiation than outer surface 18 of the first extension when solar radiation is being received by the luminescent collector. In the preferred U-shaped luminescent collector illustrated in FIG. 1, the side extensions are at least two inches long and are at angles of approximately 90° which permits the radiation collecting area of outer surface 18 to be maximized and provides for the most efficient use of the length of the side extensions.

At least one photovoltaic cell 27 is mounted on end edge surface 22 of second extension 14. Similarly, at least one photovoltaic cell 28 is mounted on end edge surface 25 of third extension 15. As hereinafter described, these cells are located in a manner such that a low light transmitting portion of the photovoltaic device is between the entire cell and the source of radiation. The cells are also entirely located away from surfaces, e.g., outer surface 18, directly receiving solar radiation from the source, that is, surfaces in straight line of sight of the source. This protects the output efficiency of the cells from excessive heating.

In FIG. 3, luminescent collector 12 has only two extensions, that is, first extension 16 and side or second extension 17. First extension 16 has outer surface 29 and inner surface 30. A major portion of outer surface 29 is adapted to receive solar radiation emanating from the source. Second extension 17 is preferably at least two inches long and has outer surface 31, inner surface 32, and end edge surface 33. First extension 16 and second extension 17 extend in a direction such that the extensions are at an angle to each other of less than 180° and in a direction such that end edge surface 33 of the second extension is further away from the source of solar radiation than outer surface 29 of the first extension when solar radiation is being received by luminescent collector 12. At least one photovoltaic cell 34 of the type previously described is mounted on end edge surface 33 of second extension 17.

The photovoltaic cells are adapted to receive and convert to electrical energy the solar radiation energy emitting from the luminescent collector at the end edge surfaces of the side extensions into the cells when solar radiation is being received by the outer surface of the first extension. The photovoltaic cells may be any desired size, shape, or configuration for optic coupling to a surface of the luminescent collector and made of any appropriate cell material. Herein reference is made to silicon cells because they are the most commonly used cells, but the present invention is applicable to cells using other substances, such as, germanium, indium phosphide, gallium antimonide, cadmium sulfide, cadmium selenide, cadmium telluride, zinc oxide, zinc sulfide, zinc selenide, cuprous sulfide, cupric oxide, titanium dioxide, aluminum arsenide, aluminum gallium arsenide, selenium, gallium phosphide, combinations thereof, and the like. The manufacture of such cells, p-n junction, and electrical contacts and connectors is well known. The cells may be mounted on the luminescent collector in any conventional manner that optically and appropriately couples the cell and collector in a way that light energy will leave the collector and enter the cell, for example, clear glue of the appropriate index of refraction or physical holding in place with a moisture barrier or reflective material.

The photovoltaic device will usually include appropriate weather, dirt and stress protectors or mounting brackets. For example, in FIGS. 1 and 3, most of the luminescent collector is enclosed in metal frame 35 or 35'. Outer surface 18 of luminescent collector 11 and outer surface 29 of luminescent collector 12 are covered by protector 36. This protector is made of a light transmitting material which is adapted to be located between a major part of outer surface 18 of the first extension of luminescent collector 11 and the source of solar radiation when the photovoltaic device is in operation. The protector allows the solar energy to pass through the protector into the luminescent collector. The protector may be made of one or more layers of material transparent to the desired solar radiation spectrum. Conventional materials such as tempered glass, and plastic polymeric materials are frequently used for this purpose.

In use, the first extension of the luminescent collector will receive solar radiation and act as a path for the captured energy to pass into the side extensions where the energy is conducted by reflections and successive absorptions and reradiations into the photovoltaic cells. As shown in FIGS. 1 and 3, which are not to scale, reflective material 37 covers a major portion of the light emissive areas of the edge and inner surfaces of the luminescent collector except those areas on which a photovoltaic cell is mounted. This reflective material reflects internally the solar energy radiation passing through the surface of the luminescent collector and striking the reflective material. The reflective material does not prevent light energy from entering outer surface 18, nor from leaving the luminescent collector and passing into the photovoltaic cells. The reflective or mirror-like material may be any sort of suitable reflective coating, such as polished silver, tin, aluminium, reflective paints, or a diffusively reflective material. The diffusively reflective material is preferred since it breaks up incident light to maximize the opportunities for internal reflection of the captured solar energy at angles which reduce the chances for loss of the solar energy through the less reflective surfaces of the collector, for example, outer surfaces 18 and 29.

Thermal insulating material 38 is not required for the photovoltaic devices of FIGS. 1 and 3; however, any conventional insulating material can be employed as a part of the photovoltaic device to protect the cells if desired. As shown in FIG. 1, part of the insulating material is located between photovoltaic cells 27 and 28 and the source of solar radiation when the photovoltaic device is in operation. Part of the insulating material is also located between inner surface 19 of first extension 13 and the photovoltaic cells. Similarly, in FIG. 3, part of the insulating material is located beween photovoltaic cell 34 and the source of radiation and inner surface 30 of first extension 16. In this manner, the thermal insulating material further insulates or entirely protects the photovoltaic cells from the first extension which is directly subjected to radiant heat from the source of solar radiation.

Figure 4:
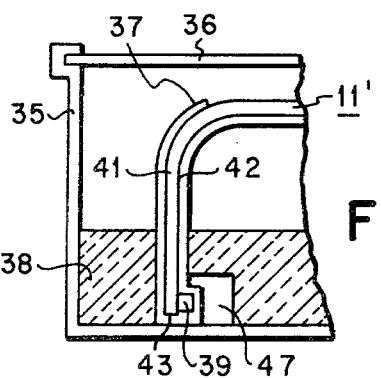
FIG. 4 is a fragmented end view of a photovoltaic panel with a side mounted insulated cell near the end of a luminescent collector.
Figure 5:
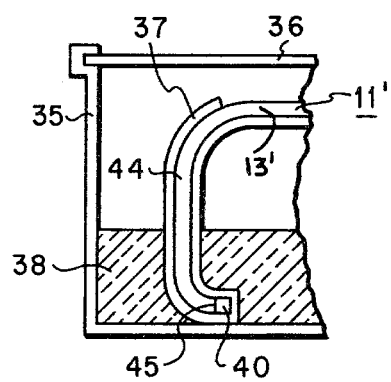
FIG. 5 is a fragmented end view of a photovoltaic panel with an insulated cell mounted on the edge surface of the curved end of a luminescent collector.

As previously noted, the photovoltaic cells are located in a manner such that a low light transmitting portion of the photovoltaic device is between the cells and the source. The source may be the sun which changes positions with time or the source may be a reflector which is focused on the photovoltaic device. The photovoltaic device may or may not be adapted to track the sun so that during operation the position of the sun relative to the luminescent collector is relatively constant. The low light transmitting portion of the photovoltaic device may be any appropriate part of the device, for example, part of the metal frame, the luminescent collector, the insulating material, or a combination thereof. As shown in FIGS. 1 and 3, during operation, at least metal frame 35 or 35' and insulating material 38 are between the source and the entire cell. Sometimes luminescent collector 11 or 12 will also be between the source and the cell. In FIGS. 4 and 5, photovoltaic cells 39 and 40 are located in a manner such that a portion of luminescent collector 11' or 11" is also between the cells and the source of solar energy.

In FIGS. 1 and 3, the side extensions of the luminescent collector are shown as terminating below metal frame 35 or 35', but the side extensions may terminate in any suitable position. Two examples are shown in FIGS. 4 and 5. In FIG. 4, side extension 41 is shown as terminating inside metal frame 35. Photovoltaic cell 39 is mounted on inner surface 42 of the side extension near end edge surface 43. In FIG. 5, side extension 44 bends inward just above metal frame 35 under first extension 13' of the luminescent collector and photovoltaic cell 40 is mounted on end edge surface 45.

If desired, forced fluid cooling of the first extension of the collector or of the photovoltaic cells may be used. The angular luminescent collector facilitates the use of forced cooling in many ways. For example, in FIG. 1, open channel 46 below first extension 13 and above thermal insulating material 38 may be used as a conduit for forced fluid cooling of the first extension. In FIG. 4, there is shown fluid channel 47 cut out of the thermal insulating material for forced fluid cooling of photovoltaic cell 39.

A photovoltaic device of the type illustrated in FIG. 1 is placed into operation by aligning outer surface 18 of the luminescent collector with the source of solar radiation. Solar energy enters the collector where the energy is absorbed by the luminescent materials and reradiated under conditions such that most of the energy cannot escape back through outer surface 18. If the luminescent collector is coated with reflective material 37, any energy that would ordinarily be lost from the collector by way of its other surfaces will strike the reflective material and will be reflected internally back into the collector. The captured solar energy thereby propagates from first extension 13 into side extensions 14 and 15 and thence to end edge surfaces 22 and 25. At these edge surfaces, the solar energy passes into photovoltaic cells 27 and 28 where the energy is converted into electrical voltage or power. Radiant heat from the solar source will usually directly heat surfaces in direct line with the source to a temperature substantially higher than ambient temperature, for example, first extension 13, protector 36, part of metal frame 35 and part of insulating material 38. But the angular luminescent collector allows the photovoltaic cells to be placed entirely away from the radiantly heated surfaces and to be entirely shielded from direct radiant heating. The cells may also be further protected by the thermal insulating material 38 and by forced fluid cooling.

Reasonable variations and modifications are possible within the scope of this disclosure without departing from the spirit and scope of this invention.

The embodiments of the invention in which an exclusive property or privilege is claimed are defined as follows:

1. A photovoltaic device for converting solar radiation to electrical energy comprising a luminescent collector member having at least first and second extensions, each of said extensions having length, width, thickness and inner and outer surfaces, a major part of said outer surface of said first extension being adapted to receive solar radiation emanating from a source, said first and said second extensions extending in a direction such that said first and second extensions are at an angle to each other and in a direction such that a photovoltaic cell may be mounted on said second extension at a point which is further from said source than said outer surface of said first extension when solar radiation is being received by said luminescent collector, and at least one photovoltaic cell mounted on said second extension of said luminescent collector, said at least one photovoltaic cell being entirely located in a manner such that a low light transmitting portion of said photovoltaic device is between said photovoltaic cell and said source and being entirely located away from surfaces directly receiving solar radiaradiation from said source, said at least one photovoltaic cell being adapted to receive and convert to electrical energy solar radiation energy emitting from said luminescent collector into said photovoltaic cell when solar radiation is being received by said luminescent collector.

2. The photovoltaic device of claim 1 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

3. The photovoltaic device of claim 1 wherein a light transmitting material is adapted to be located between said major part of said outer surface of said first extension and said source when solar radiation is being received by said luminescent collector.

4. The photovoltaic device of claim 1 wherein said second extension has an end edge surface and said at least one photovoltaic cell mounted on said second extension is mounted on at least a part of said end edge surface of said second extension.

5. The photovoltaic device of claim 4 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

6. The photovoltaic device of claim 1 wherein a portion of said luminescent collector is between said photovoltaic cell and said source.

7. The photovoltaic device of claim 1 wherein said luminescent collector has a third extension having length, width, thickness and inner and outer surfaces, said first and said third extensions extending in a direction such that said first and third extensions are at an angle to each other and in a direction such that a photovoltaic cell may be mounted on said third extension at a point which is further from said source than said outer surface of said first extension when solar radiation is being received by said luminescent collector, and at least one photovoltaic cell mounted on said third extension of said luminescent collector, said photovoltaic cell being entirely located in a manner such that a low light transmitting portion of said photovoltaic device is between said photovoltaic cell and said source and being entirely located away from surfaces directly receiving solar radiation from said source, said photovoltaic cell being adapted to receive and convert to electrical energy solar radiation energy emitting from said luminescent collector into said photovoltaic cell when solar radiation is being received by said luminescent collector.

8. The photovoltaic device of claim 7 wherein a reflective material covers a major portion of the light emissive areas of the edge and inner surfaces of said luminescent collector except those areas on which photovoltaic cells are mounted, said reflective material being adapted to reflect internal solar radiation striking said reflective material.

9. A photovoltaic device for converting solar radiation to electrical energy comprising a luminescent collector member having at least first and second extensions, each of said extensions having length, width, thickness and inner and outer surfaces, a major part of said outer surface of said first extension being adapted to receiver solar radiation emanating from a source, said first and said second extensions extending in a direction such that said first and second extensions are at an angle to each other and in a direction such that a photovoltaic cell may be mounted on said second extension at a point which is further from said source than said outer surface of said first extension when solar radiation is being received by said luminescent collector, said second extension having a length of at least two inches, and at least one photovoltaic cell mounted on said second extension of said luminescent collector, said at least one photovoltaic cell being located in a manner such that a low light transmitting portion of said photovoltaic device is between said at least one photovoltaic cell and said source and being located away from surfaces directly receiving solar radiation from said source, said at least one photovoltaic cell being adapted to receive and convert to electrical energy solar radiation energy emitting from said luminescent collector into said at least one photovoltaic cell when solar radiation is being received by said luminescent collector.

10. The photovoltaic device of claim 9 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

11. The photovoltaic device of claim 9 wherein a light transmitting material is adapted to be located between said major part of said outer surface of said first extension and said source when solar radiation is being received by said luminescent collector.

12. The photovoltaic device of claim 9 wherein said second extension has an end edge surface and said at least one photovoltaic cell mounted on said second extension is mounted on at least a part of said end edge surface of said second extension.

13. The photovoltaic device of claim 12 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

14. The photovoltaic device of claim 9 wherein a portion of said luminescent collector is between said photovoltaic cell and said source.

15. The photovoltaic device of claim 9 wherein said luminescent collector has a third extension having length, width, thickness and inner and outer surfaces, said first and said third extensions extending in a direction such that said first and third extensions are at an angle to each other and in a direction such that a photovoltaic cell may be mounted on said thid extension at a point which is further from said source than said outer surface of said first extension when solar radiation is being received by said luminescent collector, and at least one photovoltaic cell mounted on said third extension of said luminescent collector, said at least one photovoltaic cell being located in a manner such that a low light transmitting portion of said photovoltaic device is between said at least one photovoltaic cell and said source and being located away from surfaces directly receiving solar radiation from said source, said at least one photovoltaic cell being adapted to receive and convert to electrical energy solar radiation energy emitting from said luminescent collector into said at least one photovoltaic cell when solar radiation is being received by said luminescent collector.

16. The photovoltaic device of claim 15 wherein a reflective material covers a major portion of the light emissive areas of the edge and inner surfaces of said luminescent collector except those areas on which photovoltaic cells are mounted, said reflective material being adapted to reflect internal solar radiation striking said reflective material.

17. The photovoltaic device of claim 15 wherein said second and third extensions each have an end edge surface, and said at least one photovoltaic cell mounted on said second extension is mounted on at least a part of said end edge surface of said second extension and said at least one photovoltaic cell mounted on said third extension is mounted on at least a part of said end edge of said third extension.

18. The photovoltaic device of claim 17 wherein a reflective material covers a major portion of the light emissive areas of the edge and inner surfaces of said luminescent collector except those areas on which photovoltaic cells are mounted.

19. A photovoltaic device for converting solar radiation to electrical energy comprising a luminescent collector member having at least first and second extensions, each of said extensions having length, width, thickness and inner and outer surfaces, a major part of said outer surface of said first extension being adapted to receive solar radiation emanating from a source, said first and said second extensions extending in a direction such that said first and second extensions are at an angle to each other and in a direction such that a photovoltaic cell may be mounted on said second extension at a point which is further from said source than said outer surface of said first extension when solar radiation is being received by said luminescent collector, at least one photovoltaic cell mounted on said second extension of said luminescent collector, said at least one photovoltaic cell being entirely located in a manner such that a low light transmitting portion of said at least one photovoltaic device is between said at least one photovoltaic cell and said source and being entirely located away from surfaces directly receiving solar radiation from said source, said at least one photovoltaic cell being adapted to receive and convert to electrical energy solar radiation energy emitting from said luminescent collector into said at least one photovoltaic cell when solar radiation is being received by said luminescent collector, and thermal insulating material located between said at least one photovoltaic cell and said source, at least part of said thermal insulating material also being between said inner surface of said first extension and said at least one photovoltaic cell, thereby thermally insulating said at least one photovoltaic cell from said first extension.

20. The photovoltaic device of claim 19 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

21. The photovoltaic device of claim 19 wherein said second extension has an end edge surface and said at least one photovoltaic cell mounted on said second extension is mounted on at least a part of said end edge surface of said second extension.

22. The photovoltaic device of claim 21 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

23. The photovoltaic device of claim 19 wherein a portion of said luminescent collector is between said photovoltaic cell and said source.

24. The photovoltaic device of claim 19 wherein said luminescent collector has a third extension having length, width, thickness and inner and outer surfaces, said first and said third extensions extending in a direction such that said first and third extensions are at an angle to each other and in a direction such that a photovoltaic cell may be mounted on said third extension at a point which is further from said source than said outer surface of said first extension when solar radiation is being received by said luminescent collector, and at least one photovoltaic cell mounted on said third extension of said luminescent collector, said at least one photovoltaic cell being entirely located in a manner such that a low light transmitting portion of said photovoltaic device is between said at least one photovoltaic cell and said source and being entirely located away from surfaces directly receiving solar radiation from said source, said at least one photovoltaic cell being adapted to receive and convert to electrical energy solar radiation energy emitting from said luminescent collector into said at least one photovoltaic cell when solar radiation is being received by said luminescent collector.

25. The photovoltaic device of claim 24 wherein a reflective material covers a major portion of the light emissive areas of the edge and inner surfaces of said luminescent collector except those areas on which photovoltaic cells are mounted, said reflective material being adapted to reflect internal solar radiation striking said reflective material.

26. The photovoltaic device of claim 24 wherein the lengths of said second and third extensions are at least two inches.

27. The photovoltaic device of claim 24 wherein said second and third extensions each have an end edge surface, and said at least one photovoltaic cell mounted on said second extension is mounted on at least a part of said end edge surface of said second extension and said at least one photovoltaic cell mounted on said third extension is mounted on at least a part of said end edge surface of said third extension.

28. The photovoltaic device of claim 27 wherein a reflective material covers a major portion of the light emissive areas of the edge and inner surfaces of said luminescent collector except those areas on which photovoltaic cells are mounted.

29. A photovoltaic device for converting solar radiation to electrical energy comprising a luminescent collector member having at least first, second and third extensions, each of said extensions having length, width, thickness and inner and outer surfaces, a major part of said outer surface of said first extension being adapted to receive solar radiation emanating from a source, said first and said second extensions extending in a direction such that said first and second extensions are at an angle to each other and in a direction such that a photovoltaic cell may be mounted on said second extension at a point which is further from said source than said outer surface of said first extension when solar radiation is being received by said luminescent collector, said first and said third extensions extending in a direction such that said first and third extensions are at an angle to each other and in a direction such that a photovoltaic cell may be mounted on said third extension at a point which is further from said source than said outer surface of said first extension when solar radiation is being received by said luminescent collector, said second and third extensions having a length of at least two inches, and at least one photovoltaic cell mounted on said second extension of said luminescent collector, and at least one photovoltaic cell mounted on said third extension of said luminescent collector, each of said photovoltaic cells on said second extension and said third extension being entirely located in a manner such that a low light transmitting portion of said photovoltaic device is between each of said photovoltaic cells and said source and being entirely located away from surfaces directly receiving solar radiation from said source, each of said photovoltaic cells being adapted to receive and convert to electrical energy solar radiation energy emitting from said luminescent collector into each of said photovoltaic cells when solar radiation is being received by said luminescent collector.

30. The photovoltaic device of claim 29 wherein said second and third extensions each have an end edge surface, and said at least one photovoltaic cell mounted on said second extension is mounted on at least a part of said end edge surface of said second extension and said at least one photovoltaic cell mounted on said third extension is mounted on at least a part of said end edge surface of said third extension.

31. The photovoltaic device of claim 30 wherein a reflective material covers a major portion of the light emissive areas of the edge and inner surfaces of said luminescent collector except those areas on which photovoltaic cells are mounted.

32. A photovoltaic device for converting solar radiation to electrical energy comprising a luminescent collector member having at least first, second and third extensions, each of said extensions having length, width, thickness and inner and outer surfaces, a major part of said outer surface of said first extension being adapted to receive solar radiation emanating from a source, said first and second extensions extending in a direction such that said first and second extensions are at an angle to each other and in a direction such that a photovoltaic cell may be mounted on said second extensions at a point which is further from said source than said outer surface of said first extension when solar radiation is being received by said luminescent collector, said first and said third extensions extending in a direction such that said first and third extensions are at an angle to each other and in a direction such that a photovoltaic cell may be mounted on said third extension at a point which is further from said source than said outer surface of said first extension when solar radiation is being received by said luminescent collector, at least one photovoltaic cell mounted on said second extension of said luminescent collector, at least one photovoltaic cell mounted on said third extension of said luminescent collector, each of said photovoltaic cells on said second extension and said third extension being entirely located in a manner such that a low light transmitting portion of said photovoltaic device is between each of said photovoltaic cells and said source and being entirely located away from surfaces directly receiving solar radiation from said source, each of said photovoltaic cells being adapted to receive and convert to electrical energy solar radiation energy emitting from said luminescent collector into each of said photovoltaic cells when solar radiation is being received by said luminescent collector, and thermal insulating material located between said photovoltaic cells and said source, at least part of said thermal insulating material also being between said inner surface of said first extension and said photovoltaic cells, thereby thermally insulating said photovoltaic cells from said first extension.

33. The photovoltaic device of claim 32 wherein a reflective material covers a major portion of the light emissive areas of the edge and inner surfaces of said luminescent collector except those areas on which photovoltaic cells are mounted, said reflective material being adapted to reflect internally solar radiation striking said reflective material.

34. The photovoltaic device of claim 32 wherein said second and third extensions each have an end edge surface and said at least one photovoltaic cell mounted on said second extension is mounted on at least a part of said end edge surface of said second extension and said at least one photovoltaic cell mounted on said third extension is mounted on at least a part of said edge surface of said third extension.

35. The photovoltaic device of claim 34 wherein a reflective material covers a major portion of the light emissive areas of the edge and inner surfaces of said luminescent collector except those areas on which a photovoltaic cell is mounted, said reflective material being adapted to internally reflect solar radiation striking said reflective material.

36. A photovoltaic device for converting solar radiation to electrical energy comprising a luminescent collector member having at least first and second extensions, each of said extensions having length, width, thickness and inner and outer surfaces, a major part of said outer surface of said first extension being adapted to receive solar radiation emanating from a source, said first and said second extensions extending in a direction such that said first and second extensions are at an angle to each other and in a direction such that a photovoltaic cell may be mounted on said second extension at a point which is further from said source than said outer surface of said first extension when solar radiation is being received by said luminescent collector, said second extension having a length of at least two inches, and at least one photovoltaic cell mounted on said second extension of said luminescent collector, said photovoltaic cell being located in a manner such that a low light transmitting portion of said photovoltaic device is between said photovoltaic cell and said source and being located away from surfaces directly receiving solar radiation from said source, said photovoltaic cell being adapted to receive and convert to electrical energy solar radiation energy emitting from said luminescent collector into said photovoltaic cell when solar radiation is being received by said luminescent collector, and thermal insulating material located between said photovoltaic cell and said source, at least part of said thermal insulating material also being between said inner surface of said first extension and said photovoltaic cell, thereby thermally insulating said photovoltaic cell from said first extension.

37. The photovoltaic device of claim 36 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

38. The photovoltaic device of claim 36 wherein said second extension has an end edge surface and said at least one photovoltaic cell mounted on said second extension is mounted on at least a part of said end edge surface of said second extension.

39. The photovoltaic device of claim 38 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

40. A photovoltaic device for converting solar radiation to electrical energy comprising a luminescent collector member having at least first and second extensions, each of said extensions having length, width, thickness and inner and outer surfaces, a major part of said outer surface of said first extension being adapted to receive solar radiation emanating from a source, said first and said second extensions extending in a direction such that said first and second extensions are at an angle to each other and in a direction such that a photovoltaic cell may be mounted on said second extension at a point which is further from said source than said outer surface of said first extension when solar radiation is being received by said luminescent collector, said second extension having a length of at least two inches, and at least one photovoltaic cell mounted on said second extension of said luminescent collector, said photovoltaic cell being located in a manner such that a low light transmitting portion of said photovoltaic device is between said photovoltaic cell and said source and being located away from surfaces directly receiving solar radiation from said source, said photovoltaic cell being adapted to receive and convert to electrical energy solar radiation energy emitting from said luminescent collector into said photovoltaic cell when solar radiation is being received by said luminescent collector, said luminescent collector having a third extension having length, width, thickness and inner and outer surfaces, said first and said third extensions extending in a direction such that said first and third extensions are at an angle to each other and in a direction such that a photovoltaic cell may be mounted on said third extension at a point which is further from said source than said outer surface of said first extension when solar radiation is being received by said luminescent collector, and at least one photovoltaic cell mounted on said third extension of said luminescent collector, said photovoltaic cell being located in a manner such that a low light transmitting portion of said photovoltaic device is between said photovoltaic cell and said source and being located away from surfaces directly receiving solar radiation from said source, said photovoltaic cell being adapted to receive and convert to electrical energy solar radiation energy emitting from said luminescent collector into said photovoltaic cell when solar radiation is being received by said luminescent collector, and thermal insulating material is located between said photovoltaic cells and said source, at least part of said thermal insulating material also being between said inner surface of said first extension and said photovoltaic cells, thereby thermally insulating said photovoltaic cells from said first extension.

41. The photovoltaic device of claim 40 wherein a reflective material covers a major portion of the light emissive areas of the edge and inner surfaces of said luminescent collector except those areas on which photovoltaic cells are mounted, said reflective material being adapted to reflect internally solar radiation striking said reflective material.

42. The photovoltaic device of claim 40 wherein said second and third extensions each have an end edge surface and said at least one photovoltaic cell mounted on said second extension is mounted on at least a part of said end edge surface of said second extension and said at least one photovoltaic cell mounted on said third extension is mounted on at least a part of said edge surface of said third extension.

43. The photovoltaic device of claim 42 wherein a reflective material covers a major portion of the light emissive areas of the edge and inner surfaces of said luminescent collector except those areas on which a photovoltaic cell is mounted, said reflective material being adapted to reflect internally solar radiation striking said reflective material.

* * * * *